(12) United States Patent
Takahira et al.

(10) Patent No.: US 10,201,120 B2
(45) Date of Patent: Feb. 5, 2019

(54) COMPONENT MOUNTING APPARATUS

(71) Applicant: YAMAHA HATSUDOKI KABUSHIKI KAISHA, Shizuoka-ken (JP)

(72) Inventors: Isao Takahira, Tokyo (JP); Tomohiro Inoue, Tokyo (JP); Hiroshi Ikeda, Tokyo (JP); Jun Asai, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 326 days.

(21) Appl. No.: 15/027,972

(22) PCT Filed: Oct. 17, 2014

(86) PCT No.: PCT/JP2014/077709
§ 371 (c)(1),
(2) Date: Apr. 7, 2016

(87) PCT Pub. No.: WO2015/056785
PCT Pub. Date: Apr. 23, 2015

(65) Prior Publication Data
US 2016/0255754 A1    Sep. 1, 2016

(30) Foreign Application Priority Data
Oct. 17, 2013 (JP) .................. 2013-215936

(51) Int. Cl.
*H05K 13/08* (2006.01)
*H05K 13/04* (2006.01)

(52) U.S. Cl.
CPC ........... *H05K 13/08* (2013.01); *H05K 13/041* (2018.08); *H05K 13/0408* (2013.01); *H05K 13/0812* (2018.08)

(58) Field of Classification Search
CPC ........ G01B 5/18; G06K 9/00; G06K 9/00006; H04N 7/18; H05K 13/04; H05K 13/08;
(Continued)

(56) References Cited

U.S. PATENT DOCUMENTS 5,086,556 A * 2/1992 Toi .................. H05K 13/0413
29/705
5,404,163 A * 4/1995 Kubo ...................... G02B 7/36
348/142

(Continued)

FOREIGN PATENT DOCUMENTS

CN    101072495 A    11/2007
JP    2004-071641 A    3/2004
(Continued)

OTHER PUBLICATIONS

International Search Report issued in PCT/JP2014/077709; dated Dec. 9, 2014.
(Continued)

*Primary Examiner* — Carl Arbes
(74) *Attorney, Agent, or Firm* — Studebaker & Brackett, PC

(57) ABSTRACT

A component mounting apparatus having a feature in which the component mounting apparatus includes a component mounting unit including a nozzle and a distance detector for optically detecting a distance between a component held by the mounting nozzle and a board, and an illuminated region formed by the distance detector is located in a vicinity of a portion obtained by projecting the mounting nozzle onto the board.

4 Claims, 15 Drawing Sheets

(58) Field of Classification Search
CPC ............. H05K 13/0408; H05K 13/041; H05K 13/0812
See application file for complete search history.

(56) References Cited

U.S. PATENT DOCUMENTS

| | | | | |
|---|---|---|---|---|
| 5,570,993 | A * | 11/1996 | Onodera | H05K 13/0413 29/740 |
| 5,780,866 | A * | 7/1998 | Yamamura | G01B 11/026 250/201.4 |
| 5,900,940 | A * | 5/1999 | Aoshima | G01B 11/2433 250/559.34 |
| 5,903,662 | A * | 5/1999 | DeCarlo | H05K 13/0413 382/145 |
| 5,926,278 | A * | 7/1999 | Asai | G01B 11/24 348/126 |
| 6,118,540 | A * | 9/2000 | Roy | G01N 21/88 29/759 |
| 6,222,628 | B1 * | 4/2001 | Corallo | G01B 11/306 356/601 |
| 6,222,630 | B1 * | 4/2001 | Wasserman | G01B 11/245 356/388 |
| 6,496,270 | B1 * | 12/2002 | Kelley | G01B 11/0608 356/237.5 |
| 6,678,062 | B2 * | 1/2004 | Haugen | G01B 11/30 33/533 |
| 7,180,606 | B2 * | 2/2007 | Mahon | G01B 11/24 356/237.1 |
| 7,404,861 | B2 * | 7/2008 | Prentice | H05K 13/08 118/305 |
| 9,198,336 | B2 * | 11/2015 | Kihara | H05K 13/0069 |
| 9,230,339 | B2 * | 1/2016 | Wexler | G06T 7/602 |
| 2002/0078580 | A1 | 6/2002 | Haugen et al. | |
| 2009/0125141 | A1 | 5/2009 | Noda et al. | |
| 2012/0317804 | A1 | 12/2012 | Endo et al. | |

FOREIGN PATENT DOCUMENTS

| | | |
|---|---|---|
| JP | 2006-019469 A | 1/2006 |
| JP | 2013-045785 A | 3/2013 |
| WO | 2007/063763 A1 | 6/2007 |

OTHER PUBLICATIONS

Written Opinion issued in PCT/JP2014/077709; dated Dec. 9, 2014.
An Office Action issued by the Chinese Patent Office dated Nov. 1, 2017, which corresponds to Chinese Patent Application 201480050757.X and is related to U.S. Appl. No. 15/027,972.
The extended European search report issued by the European Patent Office on Aug. 24, 2016, which corresponds to European Patent Application No. 14853541.2-1803 and is related to U.S. Appl. No. 15/027,972.

* cited by examiner

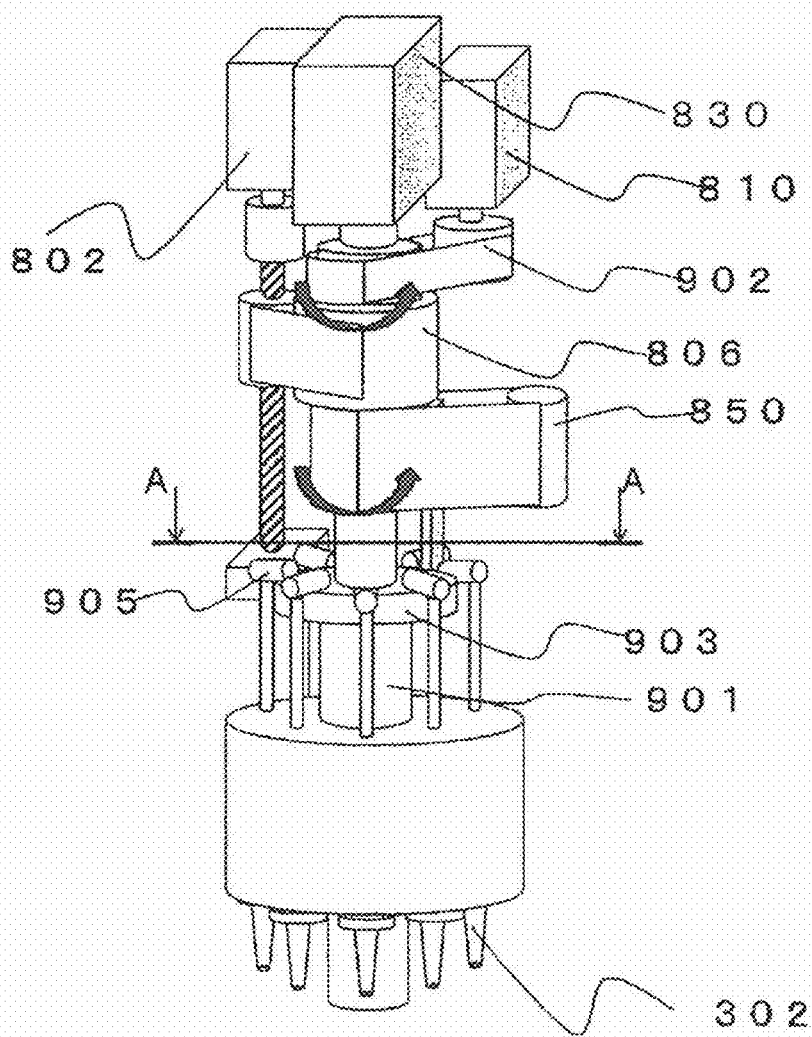

A-A ARROW VIEW

COMPONENT MOUNTING APPARATUS

CROSS REFERENCE TO RELATED APPLICATIONS

This application claims benefit of priority to Japanese Patent Application 2013-215936 filed Oct. 17, 2013, and to International Patent Application No. PCT/JP2014/077709 filed Oct. 17, 2014, the entire content of which is incorporated herein by reference.

TECHNICAL FIELD

The present disclosure relates to a component mounting apparatus. More particularly, the present disclosure relates to a component mounting apparatus for mounting an electronic component on a board after sucking the electronic component.

BACKGROUND

Operations of mounting electronic components on boards of various electronic products are currently automated, using a component mounting apparatus. The size of such electronic components has been reduced year by year. A trend in the size of electronic components is 0.4 mm×0.2 mm in the year of 2011 and is expected to be mainly 0.3 mm×0.15 mm in the year of 2014, and required packaging speed and accuracy are expected to increase.

A conventional technique for preventing damage of an electronic component is described in Japanese Unexamined Patent Publication No. 2013-45785, for example. Japanese Unexamined Patent Publication No. 2013-45785 discloses that damage of a component can be prevented by detecting curling of a board, which is a major cause for damage of an electronic component, before a production run.

SUMMARY

Problem to be Solved by the Disclosure

An approach to high-speed high-accuracy packaging is to increase the operating speed of a driving shaft and, thereby, enhance the productivity. With size reduction of an electronic component, however, when a driving shaft is operated at high speed, the electronic component might be damaged under a pressure of mounting the electronic component on a board.

A damage to electronic components is mainly due to curling of the board. If a component is mounted without consideration of the degree of curling of the board, an excessive pressure can be applied to the electronic component in some cases, resulting in possible damage of the electronic component.

Japanese Unexamined Patent Publication No. 2013-45785 discloses that the height of an entire board is measured for each board before a production run of mounting a component on a board (component mounting). However, because of an inspection for each board, a time for the inspection is needed as well as a production time, leading to a lowering in the productivity.

Means for Solving the Problem

According to the present disclosure, there is provided a distance detector for optically obtaining a distance between a component that is held and a board, and has a feature of performing at least one of the following operations of: (1) determining at least one of an acceleration or a velocity of a nozzle; and (2) changing the position of a head actuator (i.e., a nozzle holding a component).

Advantageous Effect of the Disclosure

The present disclosure can obtain at least one of the following advantages: (1) capable of preventing a damage to a component; (2) preventing a lowering in the productivity; and (3) capable of performing component mounting with high positioning accuracy even with curling of a board.

BRIEF DESCRIPTION OF DRAWINGS

FIG. 9A is a diagram illustrating a nozzle selection operation of the head actuator 801 and a height detection method.

DETAILED DESCRIPTION

An embodiment will be described hereinafter with reference to the drawings.

First Embodiment

Figure 1:
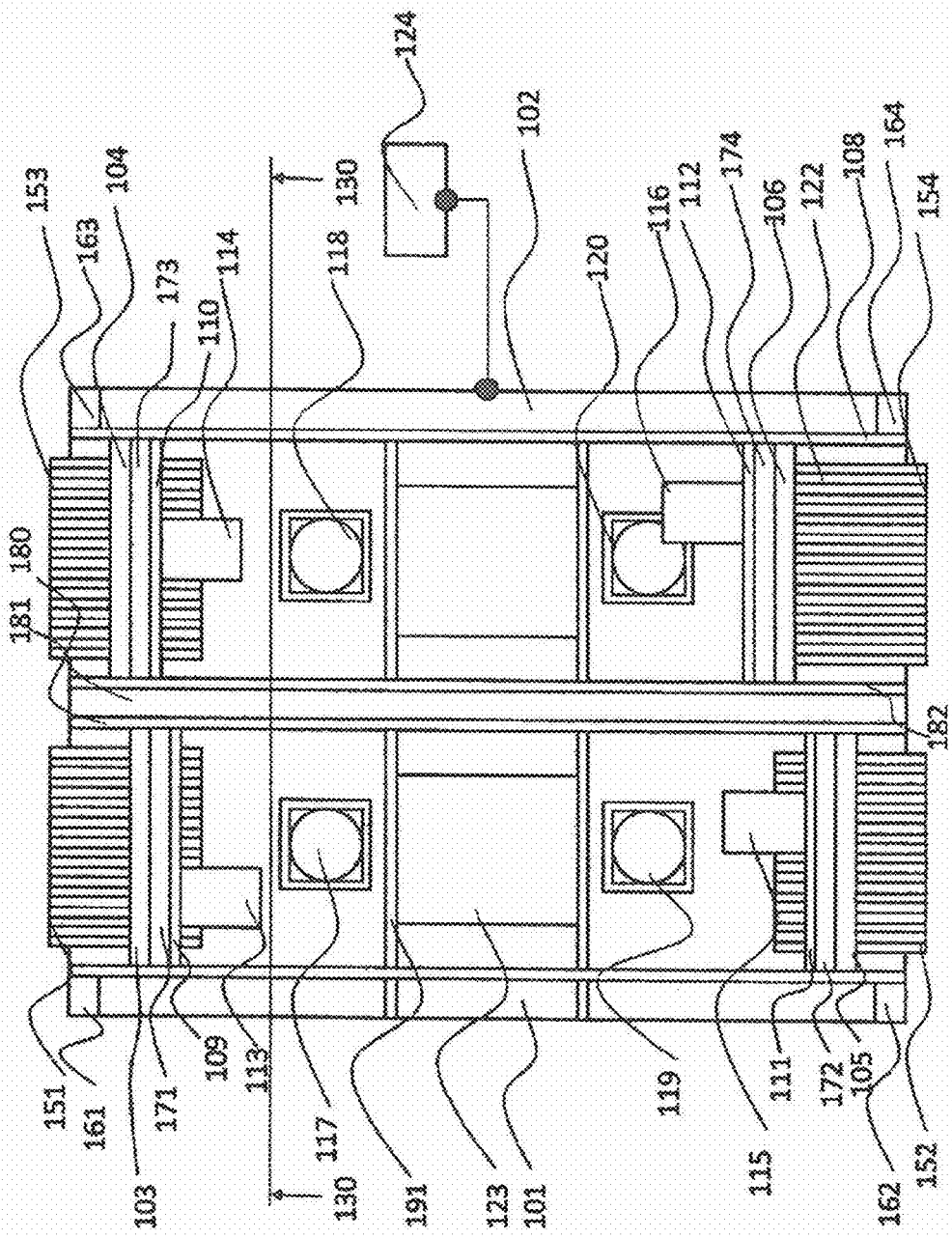
FIG. 1 is a top view illustrating an entire component mounting apparatus according to a first embodiment.

A first embodiment will be described with reference to FIGS. 1 to 14. FIG. 1 is a top view illustrating an entire component mounting apparatus according to the first embodiment.

A board 123 is conveyed by a board guide 191 from the left side in the plane of FIG. 1 to an electronic component placement position.

A first Y-beam 101, a second Y-beam 102, and a Y-beam guide 180 extend in a direction orthogonal to the conveying direction of the board.

The first Y-beam 101, the second Y-beam 102, and the Y-beam guide 180 are provided with X-beams 103, 104, 105, and 106.

The X-beams 103, 104, 105, and 106 are caused to move along rails 181 and 182 in the direction orthogonal to the conveying direction of the board by an actuator 107 such as a linear motor disposed on each of the Y-beams 101 and 102 and the Y-beam guide 180.

For the X-beams 103, 104, 105, and 106, actuators 109, 110, 111, and 112, such as linear motors, are respectively disposed.

The actuators 109, 110, 111, and 112 are respectively provided with head actuators 113, 114, 115, and 116 for mounting an electronic component on the board 123.

The actuators 109, 110, 111, and 112 are not limited to linear motors, and may be mechanisms such as ball screws, which can obtain a right-weight structure at low costs.

The head actuators 113, 114, 115, and 116 are driven in a direction orthogonal to the Y-beams 101 and 102 (a direction parallel to the board conveying direction) by the actuators 109, 110, 111, and 112, respectively.

Component supplying units 151 and 152 for supplying an electronic component to the head actuators 113 and 115 are disposed at both sides of the first Y-beam 101, and component supplying units 153 and 154 for supplying the electronic component to the head actuators 114 and 116 are disposed at both sides of the second Y-beam 102.

If there are no electronic components to be mounted, the actuators 107 and 108 move the X-beams 103, 104, 105, and 106 to positions before (or above) the component supplying units 151, 152, 153, and 154, and the actuators 109, 110, 111, and 112 move the head actuators 113, 114, 115, and 116 in optional directions, thereby supplying an electronic component.

In the component mounting apparatus, cameras 117, 118, 119, and 120 for determining a position of an electronic component is disposed between the first Y-beam 101 and the second Y-beam 102. The position of the supplied electronic component is determined by the cameras 117, 118, 119, and 120.

If a tilt in the position is detected, the head actuators 113, 114, 115, and 116 adjust the tilt of the electronic component.

With these positions of the cameras, the travel distances of the head actuators 113, 114, 115, and 116 are at a minimum in the case of mounting a component on a position near a center of the board 123.

The control unit 124 performs processing and control of operations described above and processing and control of operations described later.

The Y-beams 102 and 103 are provided with sensors 161, 162, 163, and 164 capable of measuring temperatures. The sensors 161, 162, 163, and 164 do not need to be mounted at both ends of the Y-beams.

The X-beams 103, 104, 105, and 106 are provided with sensors 171, 172, 173, and 174 capable of measuring temperatures. Positions at which the sensors 171, 172, 173, and 174 are mounted are not limited to both ends of the X-beams.

Figure 2:
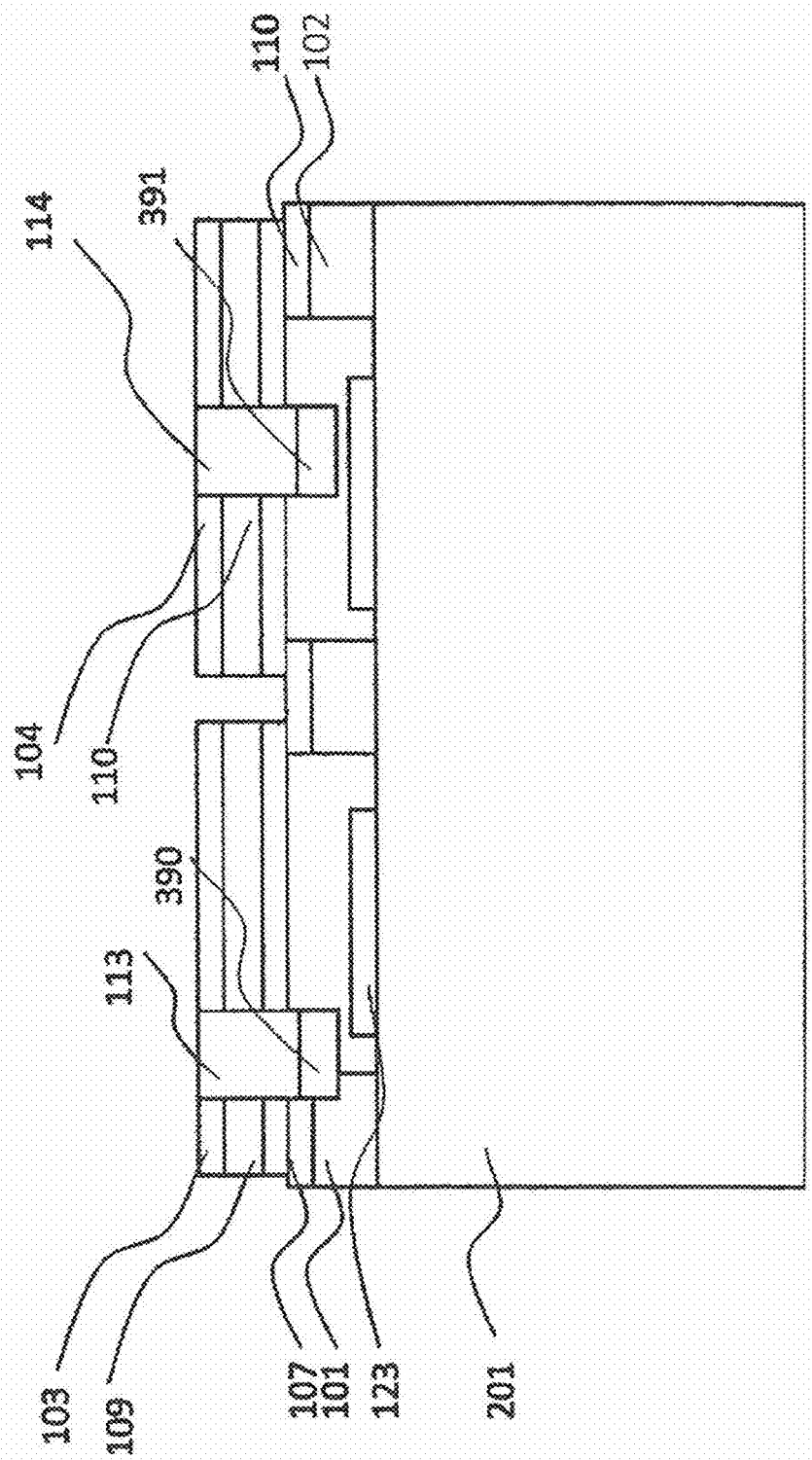
FIG. 2 is a front view of the component mounting apparatus illustrated in FIG. 1.

FIG. 2 is an arrow view in a case where the component mounting apparatus illustrated in FIG. 1 is viewed in a direction of an arrow 130 in FIG. 1.

Here, a detailed description will be given on a peripheral portion of the first Y-beam 101. The same holds for the second Y-beam 102.

The actuator 107 is disposed on the first Y-beam 101. The X-beam 103 is connected to the actuator 107 in such a manner that the X-beam 103 can freely move in a direction orthogonal to the conveying direction of the board 123 on a platform 201.

The actuator 109 is disposed in a direction perpendicular to the X-beam 103 in the plane of FIG. 2. The head actuator 113 is connected to the actuator 109 in such a manner that the head actuator 113 can freely move in a direction parallel to the board conveying direction.

As shown in the example illustrated in FIGS. 1 and 2, units are disposed to move independently of each other in directions orthogonal and parallel to the board conveying direction, thereby obtaining a component mounting apparatus that can operate at higher speed than the conventional apparatuses.

In the example illustrated in FIG. 1, four X-beams are provided. However, the number of X-beams is not limited to this example.

The X-beams 103, 104, 105, and 106 may be detachable. In this case, different types of head actuators may be connected to the X-beams so that a wider variety of components can be mounted.

The above-described beam configuration enables the head actuators 113, 114, 115, and 116 to be freely driven independently of one another.

The board 123 is held on a board conveyance passage 191 and is conveyed along the board conveyance passage 191.

Figure 3:
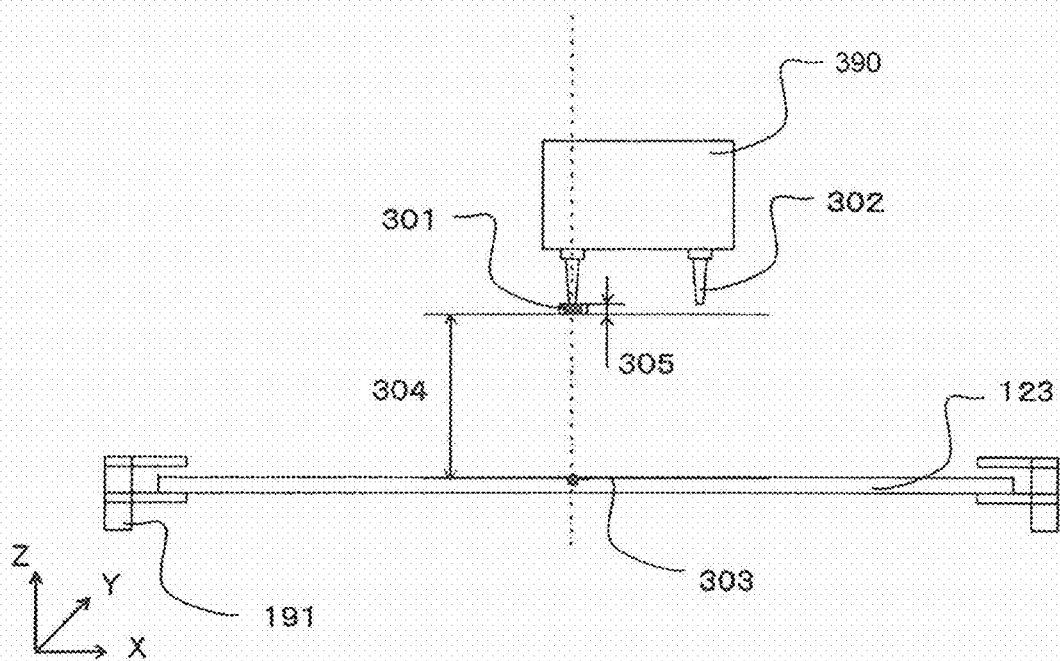
FIG. 3 is a diagram illustrating a positional relationship between a head actuator 113 and a board 123.

Referring to FIG. 3, a positional relationship between a front end 390 of a head actuator and the board 123 will be described. The following description is also applicable to other head actuators. A nozzle 302 for holding an electronic component 301 is mounted on the front end 390 of the head actuator. The head actuator 113 mounts the electronic component 301 at a target mount position 303 on the board 123 by lowering the nozzle 302 to the board 123. The board 123 is held on the board conveyance passage 191, and a height of the board 123 is defined by the board conveyance passage 191.

A travel amount 304 of the nozzle 302 down to the board 123 is determined based on a thickness of the electronic component 301 held on the board conveyance passage 191. That is, the travel amount 304 can be assumed to be substantially equal to an amount obtained by subtracting a thickness of the electronic component 301 from a known distance from the front end of the nozzle 302 to the board 123.

A travel acceleration and a velocity of the nozzle 302 are controlled in such a manner that the nozzle 302 stops near a top surface of the board. Thus, the electronic component 301 is preferably mounted on the board 123 without an excessive pressure on the board 123 and the electronic component 301.

Figure 4:
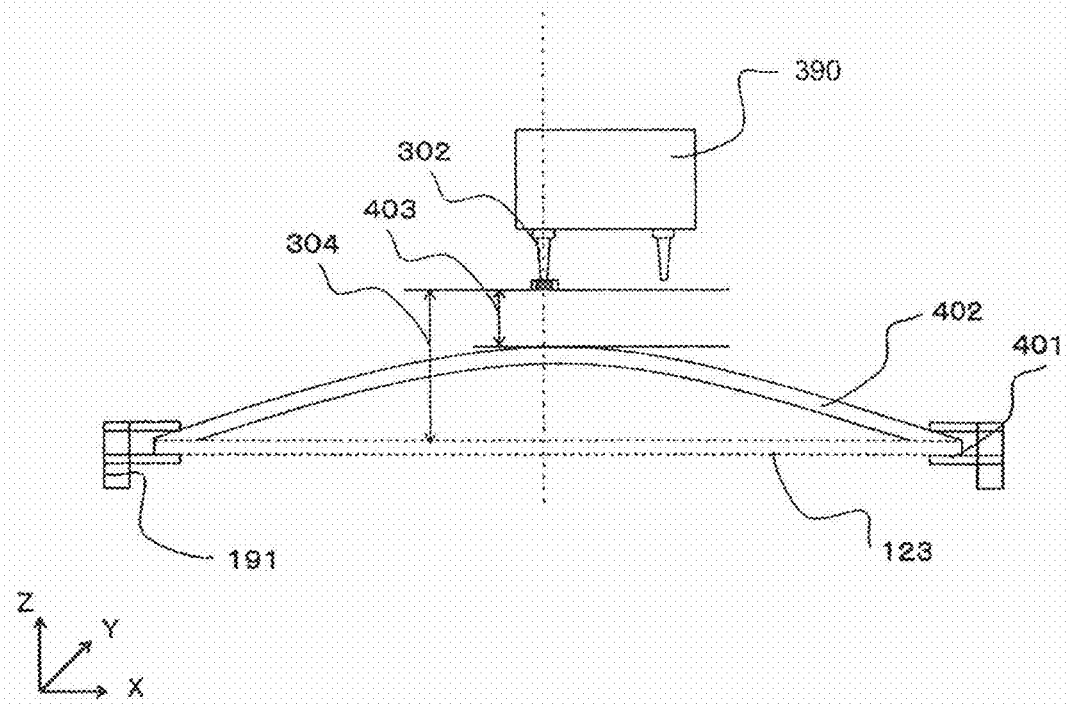
FIG. 4 is a diagram illustrating a positional relationship between a board curled upward in a direction Z and a head actuator.

Referring now to FIG. 4, a positional relationship between the head actuator 113 and the board 123 in a case where the board 123 is curled upward in a direction Z will be described.

The board 123 is in parallel to board holding unit 401 of the board conveyance passage 191 in many cases, but in some cases, a board 402 is curled upward in the direction Z.

In the case of mounting an electronic component on the mounting board 402, the nozzle 302 needs to reach the board 402 with a travel amount 403 smaller than a travel amount 304 obtained in the case of mounting an electronic component on the board 123 that is not curled.

Figure 5:
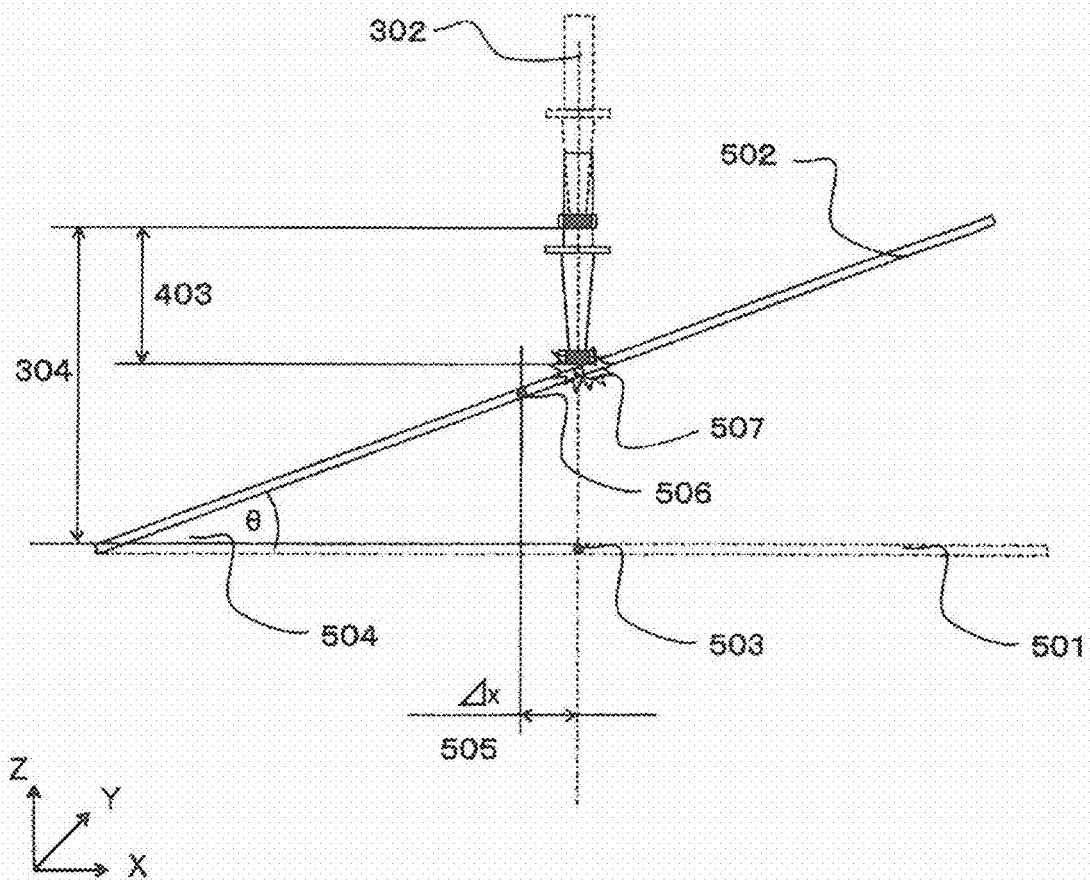
FIG. 5 is a diagram illustrating damage of a component and degradation of mounting accuracy.

Referring to FIG. 5, damage of a component and degradation of mounting accuracy in mounting an electronic component on a board will be described.

In general, a component mounting apparatus does not detect a height from the head actuator 113 to a board, and thus, even in the case of mounting an electronic component on a curled board 502, the nozzle 302 moves to the board 502 in a manner similar to a case where the nozzle 302 moves to an uncurled board 501.

A travel amount of the nozzle that moves to the uncurled board 501 is denoted by reference numeral 304. In the case of the board 502 curled upward in the direction Z, however, the travel amount of the nozzle to the board 502 should be equal to the travel amount 403.

A travel acceleration and a velocity of the nozzle 302 are controlled in such a manner that an electronic component stops near a top surface of the board 501. Thus, in a case where the nozzle 302 is used to mount an electronic component on the board 502, the travel velocity and the acceleration of the nozzle 302 are higher than those in the case of mounting an electronic component on the board 501. In this case, an excessive pressure is applied to an electronic component held on the front end of the nozzle 302, and the electronic component might be damaged as indicated by reference numeral 507.

In a case where the target mount position is a mount position 503, since the board 502 is curled at an angle 504, the mount position 503 moves to a position 506 shifted by ΔX 505 in a direction X.

Since the nozzle 302 cannot recognize a change of the mount position 503, a position on which the nozzle 302 mounts an electronic component is a mount position 507. Specifically, the electronic component is unintentionally mounted on a position different from the position 503, which is a target mount position on a curled board, in some cases. This description is directed to damage of a component and an error in mounting accuracy occurring in the direction X, and similar description is applicable to a direction Y will be described.

Figure 6:
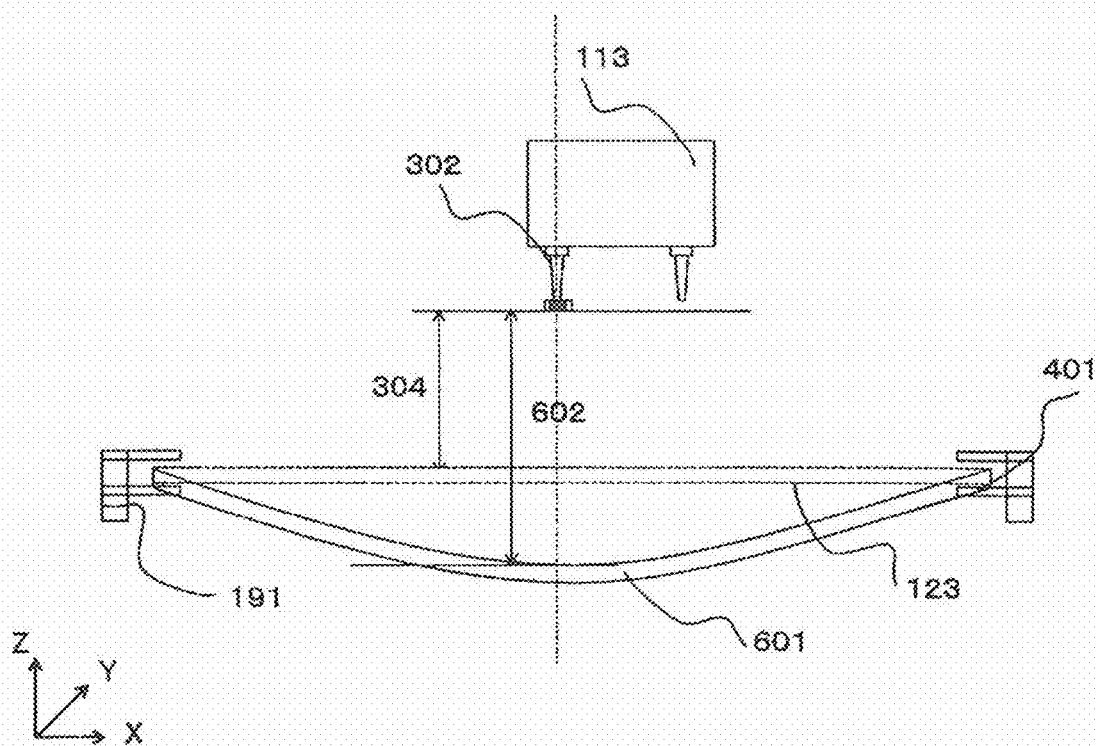
FIG. 6 is a diagram illustrating a positional relationship between a board curled downward in the direction Z and a head actuator.

Referring to FIG. 6, a positional relationship between a head actuator 113 and a board in a case where the board is curled downward in the direction Z.

The board 123 is oriented in parallel to the board holding unit 401 of the board conveyance passage 191 in many cases, but in some cases, a board 601 is curled downward in the direction Z.

In the case of mounting an electronic component on the board 601, the nozzle 302 reaches the board 601 with a travel amount 602 larger than the travel amount 304 obtained in the case of mounting a component on the board 123.

Figure 7:
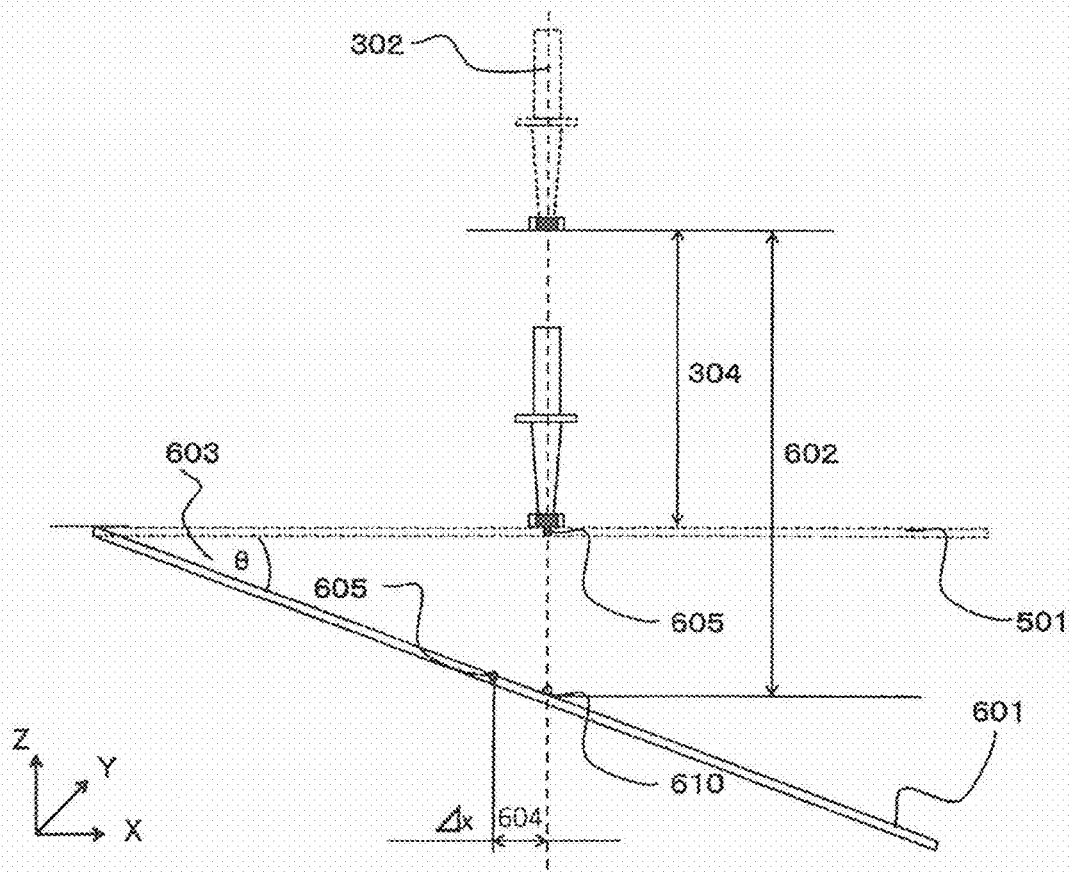
FIG. 7 is a diagram illustrating a situation where a nozzle does not reach a board and degradation of mounting accuracy.

Referring to FIG. 7, a failure in mounting an electronic component on a board and degradation of a mounting accuracy will be described.

Since the component mounting apparatus does not detect a height from the head actuator 113 to a board, even in the case of mounting a component on a curled board 610, the nozzle 302 moves in a manner similar to a case where the nozzle 302 reaches the uncurled board 501.

A travel amount of the nozzle that moves to the uncurled board 501 is denoted by reference numeral 304. In the case of the board 601 curled downward in the direction Z, however, the travel amount of the nozzle that reaches the board 601 should be equal to the travel amount 602.

The travel acceleration and the velocity of the nozzle 302 are controlled in such a manner that the nozzle 302 stops near a top surface of the board 501. Thus, even in a case where the nozzle 302 mounts a component on the board 601, the nozzle 302 is controlled to stop on the board 501, and thus, the nozzle 302 does not reach the board 601 so that a component held on the front end of the nozzle 302 might fail to be mounted under a necessary pressure.

In this case, a target mount position is a mount position 605. Since the board 601 is curled at an angle 603, the mount position 605 moves to a position shifted by ΔX 604 in the direction X.

Since the nozzle 302 cannot recognize a change of the mount position 605, a position on which the nozzle 302 mounts an electronic component is a mount position 610. That is, the electronic component might be mounted on a position different from a target mount position on a curled board. This description is directed to damage of a component and an error in mounting accuracy occurring in the direction X, and similar description is applicable to the direction Y.

This embodiment has been made in consideration of such undesirable situations. A head actuator 801 according to this embodiment will be described hereinafter.

Figure 8:
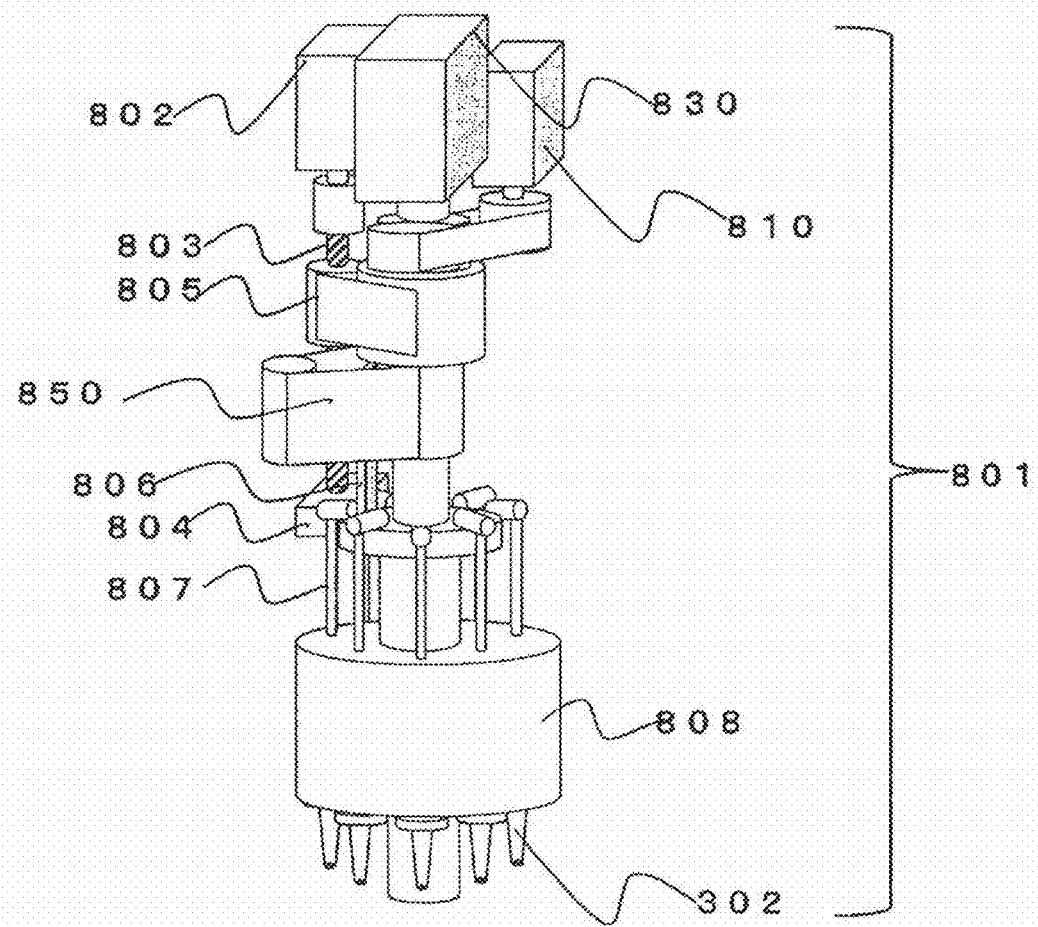
FIG. 8 illustrates a head actuator 801 including a distance detection sensor.

FIG. 8 illustrates the head actuator 801 of this embodiment. The head actuator 801 mainly includes a nozzle rotating mechanism, a nozzle elevating mechanism, and a nozzle selecting mechanism.

The head actuator 801 is connected to the X-beam 103 illustrated in FIG. 2. A ball screw 803 is connected to a nozzle elevating motor 802. An end portion of the ball screw 803 is supported on a guide 804.

The ball screw 803 is connected to an arm 805. A front end of the arm 805 is connected to a nozzle moving unit 806 that is connected to hollow nozzle shafts 807. The nozzle shafts 807 are connected to a rotor 808.

Nozzles 302 each used for sucking an electronic component and having an opening are detachably connected to front ends of the nozzle shafts 807.

A nozzle rotating motor 830 has a function of rotating the nozzles 302 using a center of the head actuator 801 as a rotary shaft.

A configuration of the head actuator 801 will now be more specifically described with respect to a selection operation, an elevation operation, and rotation movement of the nozzles.

Figure 9B:
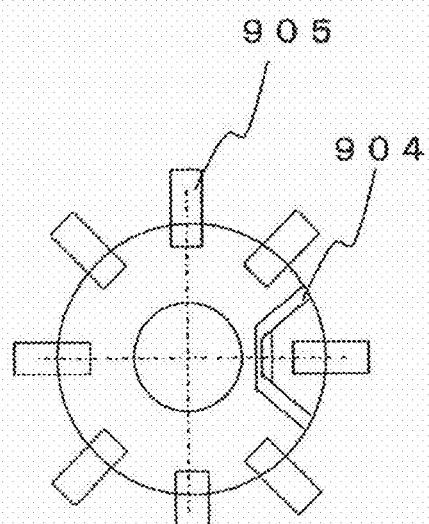
FIG. 9B is a diagram illustrating a nozzle selection operation of the head actuator 801 and the height detection method.

FIGS. 9A and 9B are views illustrating a nozzle selection operation of the head actuator 801 and an operation of the distance detection sensor in detail.

First, a nozzle selection operation will be described. In a center spline 901, when a nozzle selecting belt 902 is rotated by a nozzle selection motor 810, the center spline 901 rotates accordingly, and the nozzle moving unit 806 connected to the center spline 901 and a nozzle base 903 rotate in synchronization with rotation of the center spline 901 by the same angle. With the rotation of the nozzle base 903, a notch 904 rotates. In this manner, an intended nozzle on the nozzle base can be selected. A rotary body 905, such as a roller, connected to the nozzle shafts 807 is in contact with the nozzle base 903, and thus, an influence of friction occurring during rotation of the nozzle base 903 can be reduced. In consideration of the influence of dust emission, a hardness of the rotary body 905 is preferably equal to a hardness of the nozzle base 903.

A distance detection sensor 850 is a sensor that detects a height from the head actuator 801 to a board on which a component is to be mounted. The distance detection sensor 850 moves to a position near a selected nozzle by rotating at substantially the same angle as a rotation angle of the nozzle moving unit 806 by an operation of the nozzle selection motor 810.

Figure 10:
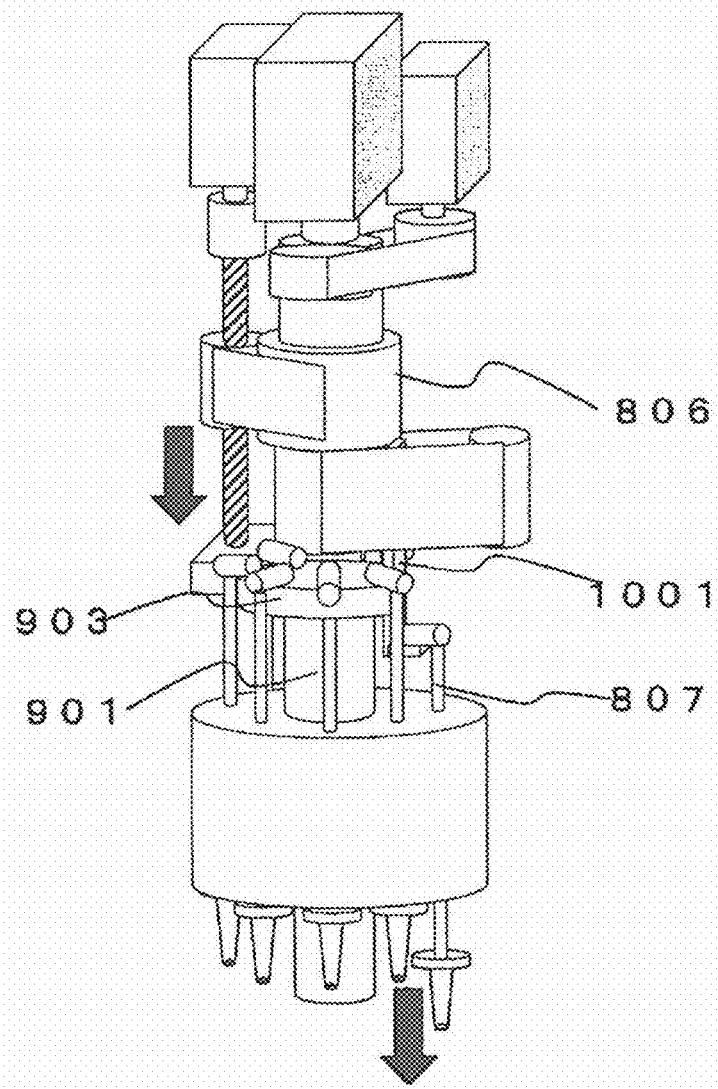
FIG. 10 is a diagram illustrating a nozzle elevation operation of the head actuator 801.

Referring now to FIG. 10, an elevation operation of a nozzle will be described. The nozzle moving unit 806 is connected to the center spline 901. The center spline 901 serves as a guide that defines a moving direction of the nozzle moving unit 806. A front end 1001 of the nozzle moving unit 806 is disposed inside the notch 904 of the nozzle base 903 illustrated in FIG. 8.

The nozzle shafts 807 are disposed on the nozzle base 903 with the rotary body 905 interposed therebetween. When the nozzle moving unit 806 is caused to move vertically by the nozzle elevating motor 802, the rotary body 905 disposed on the front end 1001 of the nozzle moving unit 806 and connected to the nozzle moving unit 806 and the nozzle shaft 807 connected to the rotary body 905 move vertically accordingly.

This configuration enables an effective selection operation and an effective elevation operation in a limited space of the head actuator 801.

Figure 11:
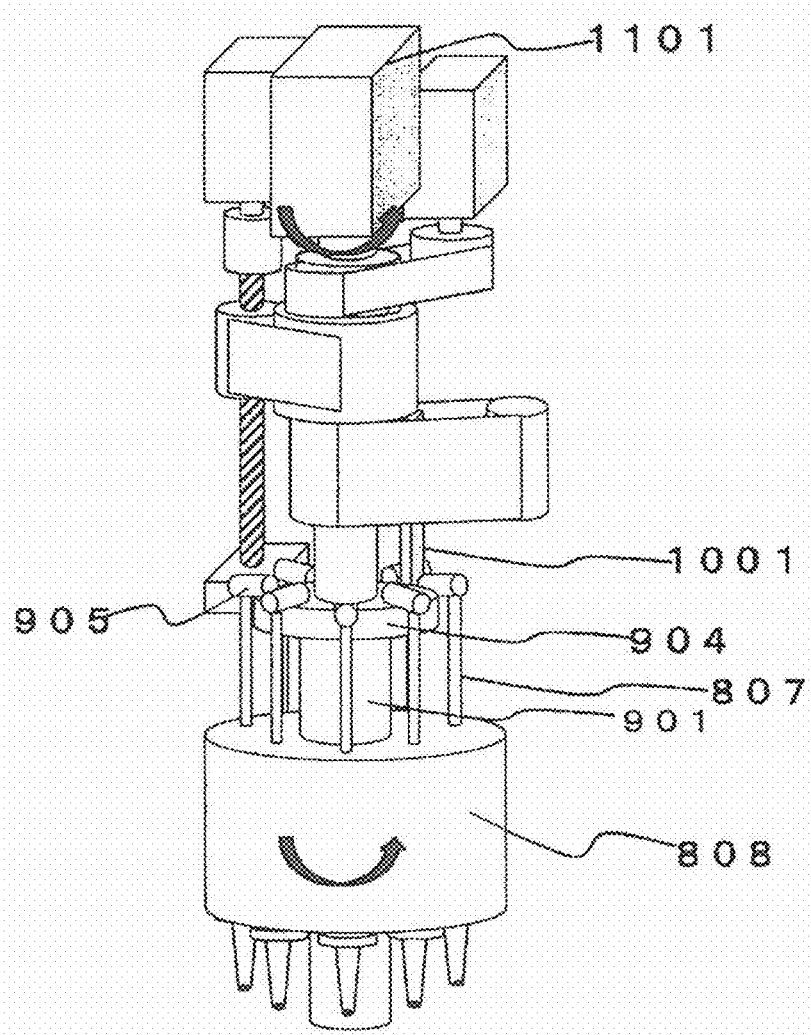
FIG. 11 is a diagram illustrating a nozzle rotation movement of the head actuator 801.

Referring now to FIG. 11, head rotation movement will be described. A nozzle rotating motor 1101 causes the nozzle shaft 807 attached to the rotor 808 to rotate about a center of the rotor 808 by rotating the rotor 808. In this manner, the rotary body 905, such as a roller, attached to the nozzle shafts 807 rotates on the nozzle base 904. Thus, an intended nozzle shaft 807 can move by an intended angle, and can move to the nozzle moving unit 806.

Figure 12:
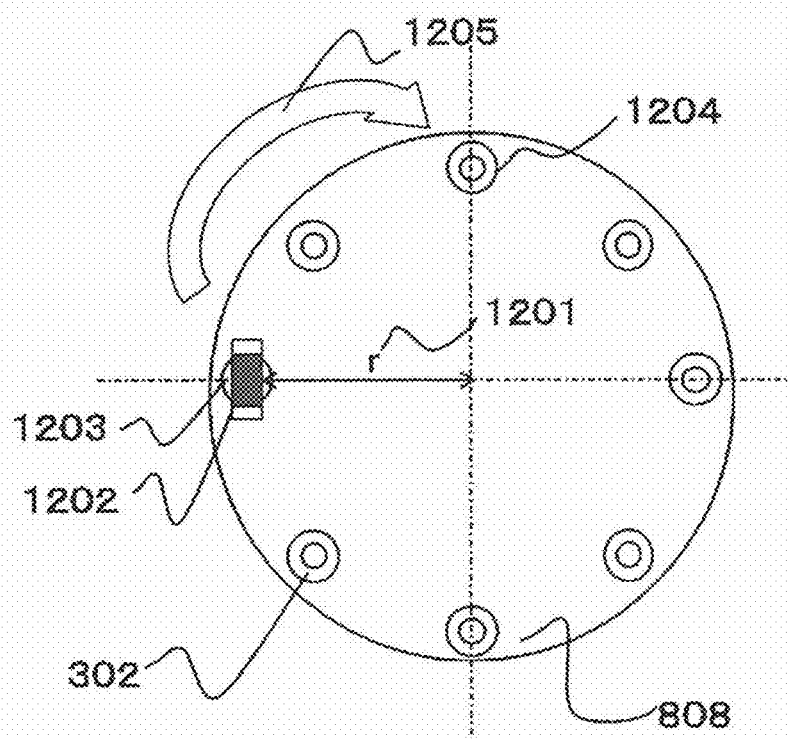
FIG. 12 is a bottom view of the head actuator 801.

FIG. 12 is a bottom view of the rotor 808. The nozzles 302 are concentrically disposed on the rotor 808 at a distance 1201 from the center of the rotor 808. With respect to the distance, the nozzles 320 may not be concentric. One of the nozzles 302 holds an electronic component 1202 in a vacuum. The nozzles 302 move in a rotation direction 1205 by cooperation of the nozzle rotating motor 1101 and the rotor 808. The nozzles 302 move in order to change an angle appropriate for mounting the electronic component 1202 on a board or to measure an angle of the electronic component 1202, in some cases.

Figure 13:
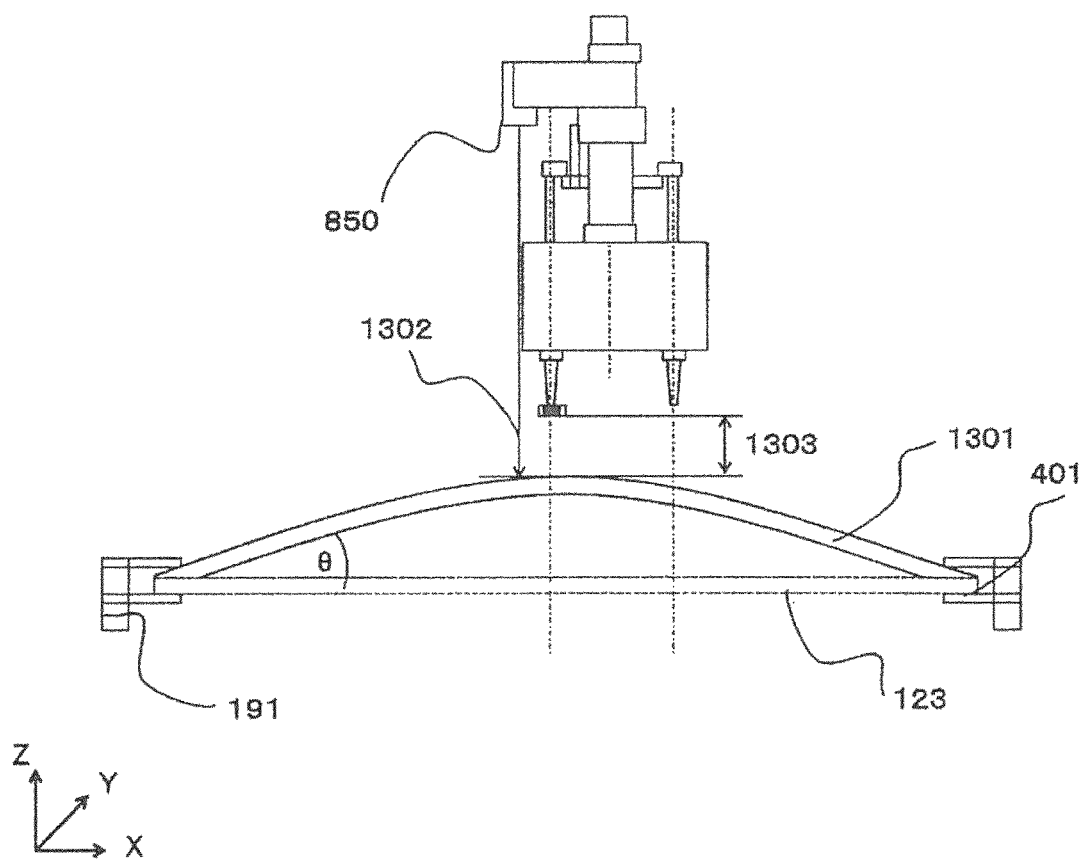
FIG. 13 is a diagram illustrating a board height detection by a distance detection sensor.

Referring to FIG. 13, a method for detecting a height near a nozzle by using the distance detection sensor 850 will be described. The distance detection sensor 850 moves to a position near a nozzle selected by an operation of the nozzle selection motor.

The distance detection sensor 850 optically measures a distance between a component held and a board 1301, and includes a laser length measuring device, for example. An optical axis 1302 of light from the distance detection sensor 850 is located outside the rotor 808. An illuminated region formed on the board 1301 by the distance detection sensor 850 is located in a vicinity of a point obtained by projecting a nozzle approaching the board 1301 for component mounting onto the board 1301. The term "vicinity" herein refers to a positional relationship that a distance between an illuminated region formed on the board 1301 by the distance detection sensor 850 and the point obtained by projecting a nozzle approaching the board 1301 for component mounting onto the board 1301 is smaller than a distance between the illuminated region and a point obtained by projecting any one of the other nozzles onto the board 1301, for example.

A method for obtaining a distance 1303 between the board 1301 and an electronic component by the distance detection sensor 850 will now be described. For example, the distance detection sensor 850 first measures a distance $D_0$ from the distance detection sensor 850 to the board 1301. Next, a known distance $D_1$ from the distance detection sensor 850 to the electronic component is subtracted from $D_0$, thereby obtaining a distance $D_2$. The distance $D_2$ can be assumed to be substantially equal to a distance 1303 from the board 1301 to an electronic component in FIG. 13. In this manner, the distance detection sensor 850 obtains the distance 1303 between the board 1301 and the electronic component. Although the distance 1303 is not a distance from a position on the board 1301 to which a nozzle descends to the component, the illuminated region formed on the board 1301 by the distance detection sensor 850 is located in a vicinity of the point obtained by projecting a nozzle approaching the board 1301 for component mounting onto the board 1301 as described above, and thus, the distance 1303 can be assumed to be substantially equal to a distance from a position on the board 1301 to which the nozzle descends to the component.

The control unit 124 illustrated in FIG. 1 determines at least one (preferably both) of an acceleration and a velocity for enabling a nozzle holding an electronic component to approach the board 1301 from the obtained distance 1303. More specifically, the control unit 124 determines at least one (preferably both) of the acceleration and the velocity of the nozzle in such a manner that at least one (preferably both) of the acceleration and the velocity of the nozzle is substantially zero on the board 1301. The determination of at least one (preferably both) of the acceleration and the velocity after obtaining the distance 1303 is performed within a period in which the head actuator 801 supplies a component from one of the component supplying units 151, 152, 153, and 154 and a nozzle holding the component starts descending toward the board 1301. That is, unlike a conventional technique, it is unnecessary in this embodiment to provide additional time for measuring the entire board and obtaining the distance 1303.

Thus, in this embodiment, damage of a component can be effectively prevented without degradation of productivity.

Figure 14:
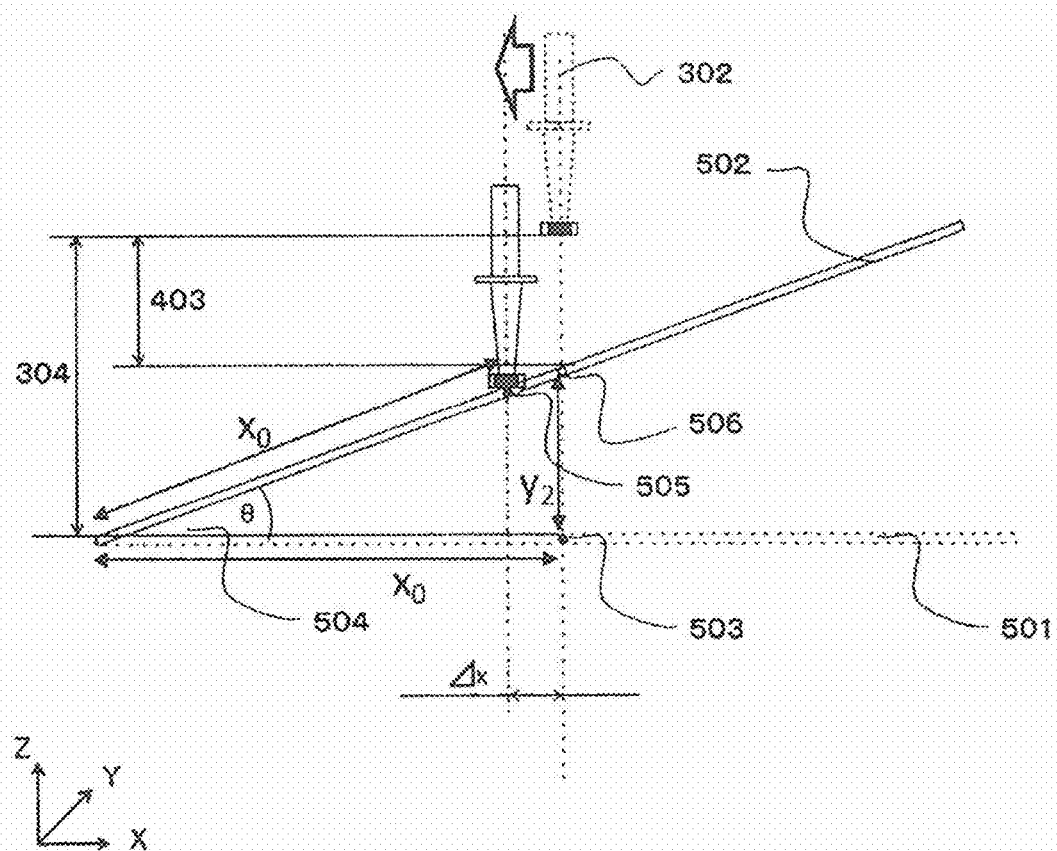
FIG. 14 is a diagram illustrating a change in a nozzle position using a detection result of the distance detection sensor.

Referring now to FIG. 14, a method for changing the position of a nozzle by obtaining a shift in target mount position due to a tilt of a board will be described.

First, since coordinates of an end of the board 502 can be previously obtained, a distance $x_0$ to the target mount position 503 in a case where the board 502 is not curled from an end thereof illustrated in FIG. 14, can also be obtained.

A distance 304 ($y_0$) from the electronic component held to the uncurled board 501 is known because this distance 304 ($y_0$) can be obtained from an original design value. A distance 404 ($y_1$) from the component held to the curled board 502 can be obtained from the distance detection sensor 850. As a result, $y_2$ illustrated in FIG. 14 can be obtained as $y_2=y_0-y_1$. From $\tan \theta = y_2/x_0$, the value $\theta$ can be obtained. Since a distance from an end of the board 502 to a target mount position 505 on the board 502 can be assumed to be substantially equal to a distance $x_0$ from an end of the board 502 to a target mount position 503 on an uncurled board, $\Delta x$ can be obtained as $\Delta x = x_0 \cos \theta$ by using a complex plane. The distance detection sensor 850 can be expressed as a height detection sensor because a height $y_2$ of the target mount position 505 can be obtained from a detection result of the distance detection sensor 850.

After $\Delta x$ is obtained, one of the actuators 109, 110, 111, and 112 moves the head actuator 801 by $-\Delta x$, and component mounting is performed. This description is also applicable to the direction Y. In this embodiment, even in a case where the target mount position changes, component mounting can be accurately performed.

The head actuators of this embodiment may be applied to another component mounting apparatus as well as that of the first embodiment.

The invention claimed is:

1. A component mounting apparatus, comprising:
a component mounting unit including a mounting nozzle selected from a plurality of nozzles and a distance detector configured for optically detecting a distance between a component held by the mounting nozzle and a board, wherein
an illuminated region formed by the distance detector is located in a vicinity of a portion obtained by projecting the mounting nozzle onto the board,
and wherein
the component mounting unit further includes a nozzle selecting unit configured for selecting the mounting nozzle from the plurality of nozzles,
the illuminated region is formed in a vicinity of the mounting nozzle that is selected by the nozzle selecting unit and approaches the board for component mounting onto the board, and
the vicinity is a positional relationship in which a distance between the illuminated region and the portion obtained by projecting the selected mounting nozzle onto the board is smaller than a distance between the illuminated region and a portion obtained by projecting any one of the plurality of nozzles except the selected mounting nozzle onto the board.

2. The component mounting apparatus according to claim 1, wherein
at least one of an acceleration and a velocity of the mounting nozzle that is approaching the board is determined based on a detection result of the distance detector.

3. The component mounting apparatus according to claim 2, wherein
a horizontal position of the mounting nozzle is changed in accordance with a detection result of the distance detector.

4. The component mounting apparatus according to claim 3, wherein
the plurality of nozzles is arranged in a circular shape,
the nozzle selecting unit includes a nozzle moving unit that is configured to move the selected mounting nozzle vertically and a nozzle selection motor that is configured to rotate the nozzle moving unit in an arranged direction of the plurality of nozzles, and
the distance detector is configured to move to a position near the selected mounting nozzle by rotating at substantially a same angle as a rotation angle of the nozzle moving unit by an operation of the nozzle selection motor.

* * * * *